US006855568B2

(12) United States Patent
Weiner et al.

(10) Patent No.: US 6,855,568 B2
(45) Date of Patent: Feb. 15, 2005

(54) APPARATUS AND METHODS FOR MONITORING SELF-ALIGNED CONTACT ARRAYS USING VOLTAGE CONTRAST INSPECTION

(75) Inventors: Kurt H. Weiner, San Jose, CA (US); Peter D. Nunan, Monte Sereno, CA (US); Sanjay Tandon, Hayward, CA (US)

(73) Assignee: KLA-Tencor Corporation, San Jose, CA (US)

( * ) Notice: Subject to any disclaimer, the term of this patent is extended or adjusted under 35 U.S.C. 154(b) by 0 days.

(21) Appl. No.: 09/999,843

(22) Filed: Oct. 24, 2001

(65) Prior Publication Data

US 2003/0003611 A1 Jan. 2, 2003

Related U.S. Application Data

(60) Provisional application No. 60/302,339, filed on Jun. 29, 2001.

(51) Int. Cl.[7] .............................................. H01L 21/66
(52) U.S. Cl. ................. 438/17; 438/6; 438/10; 438/11; 438/14; 438/18; 438/775; 438/776; 438/777
(58) Field of Search .................. 438/6, 10, 11, 438/14, 16, 17, 18, FOR 101, 5, 7, 8, 4, FOR 102, FOR 434, FOR 142; 257/E21.53, 48, 911; 324/158, 73.1, 500, 501, 765, 769, 751, 766

(56) References Cited

U.S. PATENT DOCUMENTS

| | | | |
|---|---|---|---|
| 4,900,695 A | * | 2/1990 | Takahashi et al. ........... 438/625 |
| 5,430,305 A | * | 7/1995 | Cole, Jr. et al. ........ 250/559.07 |
| 5,502,306 A | | 3/1996 | Meisburger et al. ........ 250/310 |
| 5,578,821 A | | 11/1996 | Meisberger et al. ........ 250/310 |
| 5,665,968 A | | 9/1997 | Meisburger et al. ........ 250/310 |
| 5,717,204 A | | 2/1998 | Meisburger et al. ........ 250/310 |
| 5,959,459 A | | 9/1999 | Satya et al. ................. 324/751 |
| 5,976,898 A | | 11/1999 | Marty et al. .................. 438/12 |
| 6,038,018 A | | 3/2000 | Yamazaki et al. ........ 356/237.1 |
| 6,091,249 A | * | 7/2000 | Talbot et al. ................ 324/751 |
| 6,210,983 B1 | | 4/2001 | Atchison et al. .............. 438/14 |
| 6,232,787 B1 | * | 5/2001 | Lo et al. ...................... 324/751 |
| 6,252,412 B1 | | 6/2001 | Talbot et al. ................ 324/750 |
| 6,344,750 B1 | | 2/2002 | Lo et al. ...................... 324/751 |
| 6,448,098 B1 | | 9/2002 | Milor .......................... 438/17 |

FOREIGN PATENT DOCUMENTS

| | | | |
|---|---|---|---|
| EP | 0853243 A2 | 7/1998 | ......... G01R/31/305 |
| EP | 092275 A2 | 1/1999 | ......... G01R/31/307 |

* cited by examiner

*Primary Examiner*—George Fourson
*Assistant Examiner*—Julio J. Maldonado
(74) *Attorney, Agent, or Firm*—Beyer Weaver & Thomas LLP

(57) ABSTRACT

Disclosed are methods and apparatus for detecting defects in a partially fabricated semiconductor device with self-aligned contacts. The self-aligned contacts are formed from a first layer with a plurality of contact portions, a second layer with a plurality of conductive lines that are each aligned proximate to an associated underlying contact portion, and a third insulating layer formed over the conductive lines and their proximate underlying contact portions. The third insulating layer has a plurality of vias formed therein that are each formed alongside a one of the conductive lines and over its proximate underlying contact portion. A charged particle beam is scanned over a portion of the vias to form a voltage contrast image of each via. When a minority of the vias in the image have a significantly different brightness level than a majority of the vias, it is then determined that the minority of vias have defects.

21 Claims, 12 Drawing Sheets

US 6,855,568 B2

APPARATUS AND METHODS FOR MONITORING SELF-ALIGNED CONTACT ARRAYS USING VOLTAGE CONTRAST INSPECTION

CROSS-REFERENCE TO RELATED APPLICATION

This application takes priority under U.S.C. 119(e) of U.S. Provisional Application No. 60/302,339 filed Jun. 29, 2001 entitled, "APPARATUS AND METHODS FOR MONITORING SELF-ALIGNED CONTACT ARRAYS" Kurt H. Weiner, Peter D. Nunan, and Sanjay Tandon which is incorporated by reference in its entirety for all purposes.

BACKGROUND OF THE INVENTION

This invention relates to a method and apparatus for defect detection in a semiconductor structure having a plurality of self-aligned contacts. More specifically, it relates to detection of defects caused by the self-aligned contact etch process.

Self-aligned contacts are typically utilized in densely packed array structures, such as a DRAM memory structure. FIG. 1A is a diagrammatic side view of a partially fabricated self-aligned contact 100 prior to the self-aligned contact etch process. Initially, a source or drain 104 is formed in a substrate 102 such as silicon. A gate oxide 106 is then deposited over the substrate 102 and source or drain 104. A gate 108 is then formed from a conductive material, such as polysilicon or tungsten silicide. Dielectric or insulating spacers 110 (e.g., $SiO_2$) are then formed and patterned around the gate 108. A thin insulating layer 112 is then formed and patterned over the gate oxide 106, the spacers 110, and the source or drain 104. A dielectric layer 114 (e.g., $SiO_2$, FSG, Low K) is then deposited over the gate oxide 106, the thin insulating layer 112, and the source or drain 104. The dielectric layer 114 is patterned for contact/via 122 and etched such that a contact is formed to the substrate 102 through the gate oxide 106.

The thin insulating layer 112 is typically formed from a material that serves as a barrier to the subsequent self-aligned contact etch process. For example, the barrier 112 is typically a nitride material (e.g., $Si_3N_4$ or SiON that is 30 to 40 nm thick), and the self-aligned contact etch is selected to not etch a nitride material. FIG. 1B illustrates a diagrammatic side view of the self-aligned contact after the self-aligned contact etch process completes without etching through the thin insulating layer 112. As shown, the self-aligned contact etch process typically etches through the dielectric material 114 but not the barrier material 112 to form a via 124. That is, the etching process selectively etches the dielectric material 114. Accordingly, the gate 108 remains electrically isolated from the via 124 as a result of the thin insulating layer 112. A conductive plug 116 is then deposited (e.g., by chemical or physical vapor deposition) into via 124. The conductive plug may be any suitable conductive material, such as tungsten. A conductive line 118 is then formed and patterned over the conductive plug 116a. When the self-aligned contact etch process is selective, the gate 108 remains electrically isolated from the source or drain 104, the conductive plug 116a, and the conductive line 118.

FIG. 1C is a diagrammatic side view of a self-aligned contact 100' with a barrier layer 112' that has been breached by the self-aligned contact etch process. The barrier layer 112' may be breached when the etching process fails to be selective. As a result of this failure, the gate 108 is now electrically coupled with the source or drain 104, the electric plug 116', and the conductive line 118. Of course, this defect 120 is a killer defect since the transistor is no longer capable of functioning properly.

Several techniques are available for detecting defects caused by the self-aligned contact etch process. However, these techniques are typically performed after the wafer is removed from the fabrication line and after formation of the conductive lines (e.g., 118) that tie the self-aligned contact structures together. In one technique, the wafer is probed off-line to determine whether the conductive lines are shorted to the gates. Large conductive pads are typically formed within this conductive layer to facilitate probing. Hence, this technique requires extra real estate in the form of probe pads for the probe testing.

Another technique employs "short loop" wafers that are specifically designed to test a particular type of structure, such as a self-aligned contact structure. Short loop wafers are formed with a subset of fabrication steps. The subset of fabrication steps include key steps for forming the structure to be tested. For example, a "gate short loop" is formed from a patterned oxide layer and a patterned polysilicon layer. After the short loop wafer is fabricated, the resulting structures (e.g., gate structures) may then be tested via probing. This technique is extremely inefficient since extra masks are necessarily designed for the short loop wafer. Additionally, special process flows are required for the short loop wafer, in addition to the process flows required for the product wafers.

Both techniques require that the particular structure be completely fabricated prior to testing. The probe technique waits for completion of the conductive lines, and the short loop technique waits for completion of the short loop wafer. Thus, the product remains at risk during these waits. That is, defects can only be detected after the structure is completely fabricated. If there is a problem in an initial process step, this problem is not caught until after several process steps are subsequently completed. Additionally, both techniques require off-line probing. A probe test is also typically performed on a chain of structures (e.g., self-aligned contact structures) and, hence, only indicates whether a defect is present (or how many defects are present within the chain) and does not indicate a defect's location.

Accordingly, there is a need for improved apparatus and methods for detecting in-line defects in self-aligned contact structures and/or determining defect locations.

SUMMARY OF THE INVENTION

Accordingly, mechanisms are provided for detecting defects (e.g., open and shorts) within a plurality of self-aligned contacts (e.g., that form part of an array structure) using voltage contrast techniques. For example, an electron beam is scanned over the self-aligned contacts to form an image from the resulting voltage potential formed on the self-aligned contacts. In one embodiment, each self-aligned contact include a via formed over a contact area (e.g., source or drain of a transistor), and the via remains unfilled during the voltage contrast test. A conductive line (e.g., gate of a transistor) with a surrounding thin barrier layer is patterned on a layer above and adjacent to each via and contact area. In this embodiment, the voltage contrast test is performed in-line prior to placement of conductive plugs within the vias. During the voltage contrast inspection, a via that has a significantly different potential than a majority of other vias is classified as a defect. For example, a different potential may occur when the thin barrier layer surrounding the conductive line has a breach that thereby exposes the conductive line to the electron beam. Other vias do not have a breach and therefore do not expose the conductive line to the electron beam. A location of the determined defects may also be provided from the position of the electron beam or position of the wafer stage when a defect is found.

In another embodiment, the voltage contrast test is performed after conductive plugs are added to the vias. Once again, a significant potential difference on a selected via and conductive plug, as compared to a majority of scanned vias and plugs, is classified as a defect. The location of such defect may also be found from the position of the electron beam when it scans over a via having a significantly different potential (or from a position of the wafer stage). In another embodiment, the voltage contrast inspection is performed after formation of a second layer of conductive lines over the vias. In one embodiment, the voltage contrast inspection is performed on a product self-aligned contact structure. In one aspect, the self-aligned contact structure is a dummy structure that is coupled with a product structure. Alternatively, the voltage contrast inspection is performed on a test structure that mimics the product structure and is on the product wafer.

In one embodiment, a method of detecting defects in a plurality of self-aligned contacts on a partially fabricated semiconductor device is disclosed. Each self-aligned contact includes a via. A charged particle beam is scanned over the vias to form a voltage contrast image of each via. When a minority of the vias in the image have a significantly different brightness level than a majority of the vias, it is then determined that the minority of vias have defects.

In a specific inspection implementation, each via is unfilled. In one aspect, each self-aligned contact includes a first layer with a plurality of contact portions, a second layer with a plurality of conductive lines that are each aligned proximate to an associated underlying contact portion, and a third insulating layer formed over the conductive lines and their proximate underlying contact portions. The vias are formed within the third insulating layer, alongside a one of the conductive lines, and over its proximate underlying contact portion. Each defect is then in the form of a breach in the insulating layer over a one of the conductive lines so that the conductive line is exposed to the particle beam as it scans over the associated via, as compared with another of the conductive lines that is not defective and has the insulating layer disposed between itself and the associated via so as to form a barrier against the particle beam. In another embodiment, a location of each defect is determined from a position of the charged particle beam when each defective via is imaged(or from a position of the wafer stage. The position is correlated to a position on the semiconductor device.

In another embodiment, the scanning is performed in-line with fabrication of the semiconductor device. The self-aligned contacts may form part of product structure on a product wafer and may be arranged in an array structure. Each contact portion may form a source or drain of a transistor, and each proximate conductive line may form a gate of the transistor separated from the proximate contact source/drain by an oxide layer and the third insulating layer. The third insulating layer may include a plurality of dieletric spacers with a pair of spacers being on each side of each gate, a barrier layer over each pair of spacers, and an interlayer dielectric layer formed over the barrier layer and contact portions. The vias are formed by an etch process that is selected to etch through the interlayer dielectric layer and not the barrier layer. Each defect is in the form of a breach in the barrier layer over a one of the conductive lines so that the conductive line is exposed to the particle beam as it scans over the associated via, as compared with another of the conductive lines that is not defective and has the barrier layer disposed between itself and the associated via so as to form a barrier against the particle beam.

In another aspect, a conductive plug is provided within each via. Each defect may be in the form of a breach in the insulating layer over a one of the conductive lines so that the conductive line is shorted to the associated conductive plug. Alternatively, each defect is in the form of a open defect within the conductive plug where a top surface of the conductive plug is not electrically coupled with its associated underlying contact portion. The conductive plug may be formed from a fuse material, and each conductive plug is fused prior to scanning the via. Alternatively, the conductive plug is formed from a anti-fuse material, and the anti-fuse plugs are deactived after they are scanned. In one embodiment, the self-aligned contacts form dummy structures that are coupled with a product array of self-aligned contacts.

In a further method implementation, conductive plugs within each via and a fourth layer having a plurality of conductive lines that are each coupled to a one of the conductive plugs are provided. A charged particle beam is scanned over a portion of the fourth layer of conductive lines to form a voltage contrast image of each conductive line portion. When a minority of the conductive line portions in the image have a significantly different brightness level than a majority of the conductive line portions, it is determined that the minority of conductive line portions have defects. In one aspect, the second layer of conductive lines form a plurality of word lines within a memory array, and the fourth layer of conductive lines form a plurality of word lines within the memory array.

In an alternative embodiment, a method of detecting defects in a plurality of fabricated self-aligned contacts on a semiconductor device is disclosed. Each self-aligned contact includes a via filled with a conductive plug that is coupled to a conductive line. A charged particle beam is scanned over a portion of the conductive lines to form a voltage contrast image of each conductive line portions. When a minority of the conductive line portions in the image have a significantly different brightness level than a majority of the conductive line portions, it is determined that the minority of conductive line portions have defects.

In another embodiment, a inspection system for detecting defects in a plurality of self-aligned contacts on a partially fabricated semiconductor device on a semiconductor device is disclosed. Each self-aligned contact includes a via. The system includes a beam generator for generating a charged particle beam and directing it towards the self-aligned contacts. The system further includes a detector for detecting charged particles emitting from the self-aligned contacts in response to the generated charged particle beam and a processor and memory arranged to cause the beam generator to scan a charged particle beam over a portion of the vias to form a voltage contrast image of each via and determine that the minority of vias have defects when a minority of the vias in the image have a significantly different brightness level than a majority of the vias.

In another aspect, the invention pertains to a computer program product for detecting defects in a plurality of self-aligned contacts on a partially fabricated semiconductor device on a semiconductor device using an inspection system is disclosed. Each self-aligned contact includes a via.

The computer program product includes at least one computer readable medium and computer program instructions stored within the at least one computer readable product configured to cause the inspection system to perform one or more of the above described methods.

In another embodiment, a test structure is disclosed. The test structure includes a first plurality of conductive lines, a second plurality of conductive lines orthogonal to the second conductive lines, and a plurality of self-aligned contacts that are designed to be coupled to the first conductive lines and not the second conductive lines. The first conductive lines are on a different level than the second conductive lines. The test structure forms part of a product wafer and is designed to mimic an array structure having self-aligned contacts.

In a specific implementation, the second conductive lines are at a floating potential and the first conductive lines are at a predetermined potential. In another embodiment, the first and second conductive line mimic bit lines and word lines, respectively, of a memory device. In one aspect, the test structure is a dummy structure coupled to a product structure comprising self-aligned contacts. In a further implementation, the self-aligned contacts of the test structure are filled with an anti-fuse material that may be deactivated after inspection.

These and other features and advantages of the present invention will be presented in more detail in the following specification of the invention and the accompanying figures which illustrate by way of example the principles of the invention.

DETAILED DESCRIPTION OF SPECIFIC EMBODIMENTS

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The detection techniques of the present invention may be applied to any type of structure having a plurality of self-aligned contacts. The structure may form part of a product structure or a test structure on the product wafer that mimics a product structure. For simplicity, the techniques of the present invention are illustrated using DRAM devices formed from a plurality of self-aligned contacts. Other suitable memory devices include, but are not limited to, SRAM, ROM, EPROM, EEPROM, and flash memory. Other suitable devices, besides memory, include a gate array, sea-of-gates, microprocessor, micro-controller, and micro-electromechanical device.

Figure 2B:
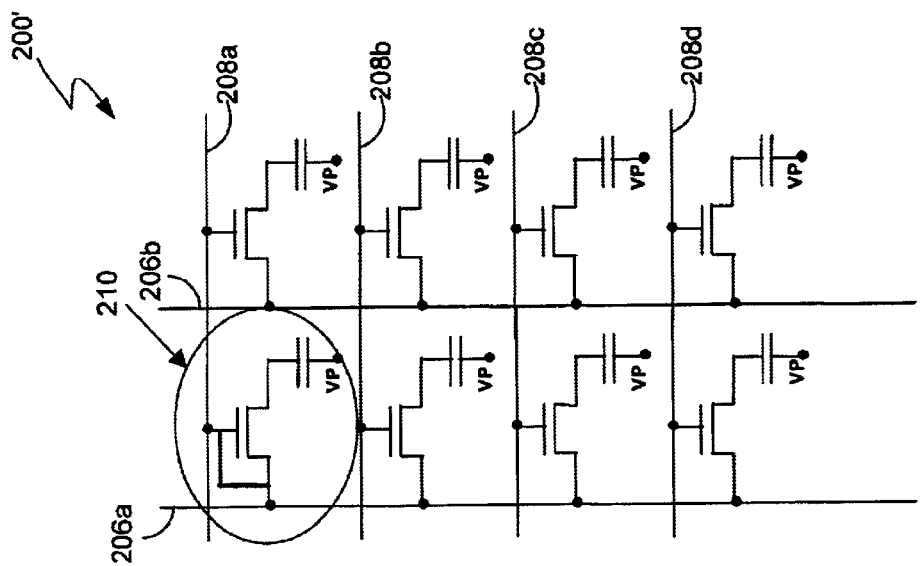
FIG. 2B is a schematic diagram of a particular DRAM cell that has failed during a self-aligned contact etch process.
Figure 2A:
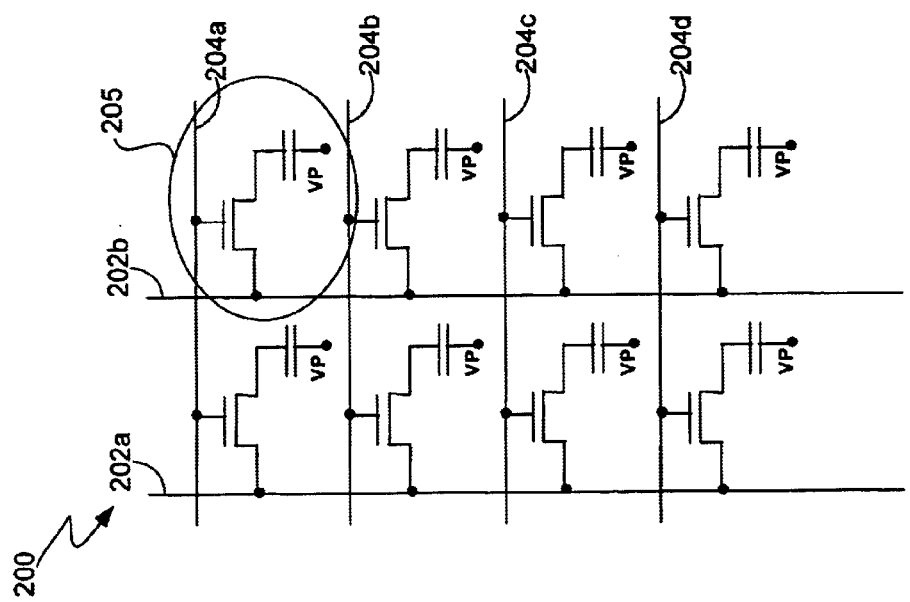
FIG. 2A is a schematic diagram of an array of DRAM cells that may be formed from self-aligned contacts.

FIG. 2A is a schematic diagram of an array of DRAM cells 200 that may be formed from self-aligned contacts. The DRAM array 200 contains a plurality of bit lines 202 and a plurality of word lines 204a. Each DRAM cell (e.g., 205) includes a transistor. Each transistor has a source or drain that is coupled to a capacitor, while the other side of the transistor is coupled to a bit line 202. The gate of the transistor is coupled to a word line (e.g., 204a).

When the etching process has succeeded in being selective and has not etched through the barrier layer, the word lines and bit lines are electrically isolated from each other as illustrated in FIG. 2A. FIG. 2B is a schematic diagram of a plurality of DRAM cells 200' with a defective DRAM cell 210 that has failed during a self-aligned contact etch process. In this failed cell 210, bit line 206a is electrically shorted to word line 20a.

Figure 3A:
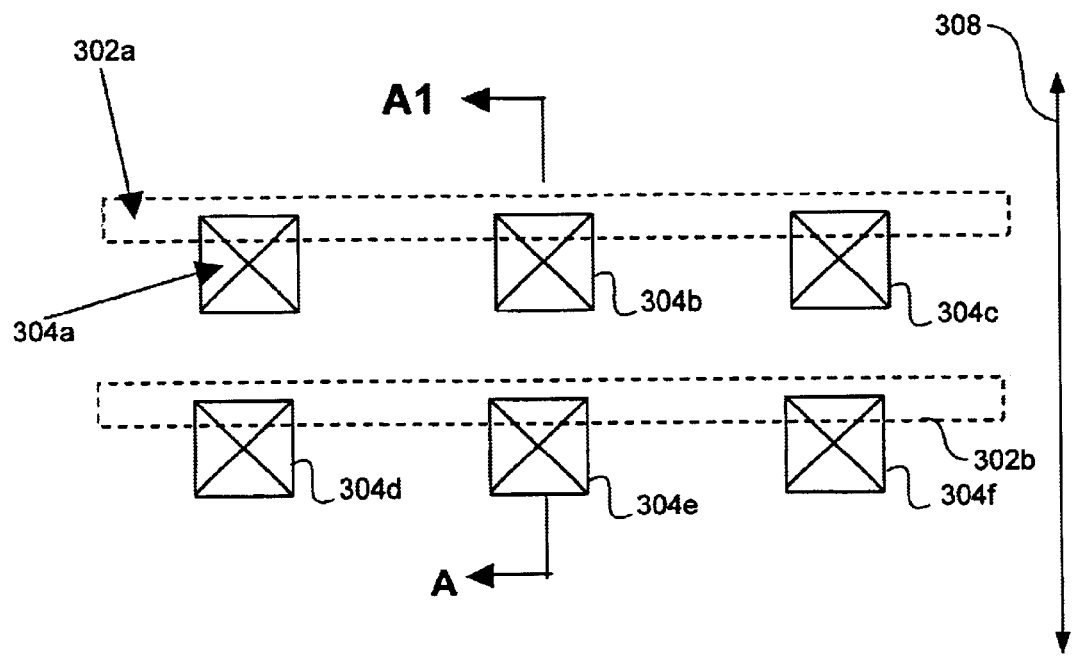
FIG. 3A is a top view of a scan of a plurality of self-aligned contacts having no defects in accordance with one embodiment of the present invention.
Figure 3B:
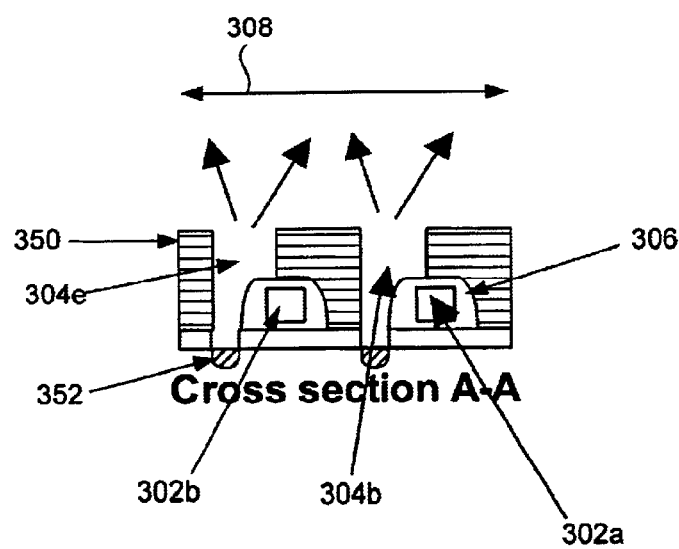
FIG. 3B is a cross sectional view of the scan of the self-aligned contacts FIG. 3A.

FIGS. 3A and 3B illustrate a scan of a plurality of self-aligned contacts having no defects in accordance with one embodiment of the present invention. Typically an inspection system is set up to scan a charged particle beam, such as an electron beam in a scanning electron microscope (SEM) or an e-beam review or inspection system, in direction 308 or orthogonal to it. For example, the electron beam is rastered across a swath as the self-aligned contacts are moved in direction 308 or orthogonal to it. In the illustrated embodiment, the swath is three self-aligned contact wide. However, the electron beam may be scanned relative to the self-aligned contacts in any suitable direction so that a portion of the self-aligned contacts are scanned by the electron beam.

FIG. 3A shows a top view of the self-aligned contacts, and FIG. 3B is a cross section A—A of FIG. 3A. As shown, a row of self-aligned contacts are coupled to a word line 302a and another row is coupled to word line 302b. The first row includes self-aligned contacts 304a, 304b, and 304c. The second row includes self-aligned contacts 304d, 304e, and 304f.

Figure 1A:
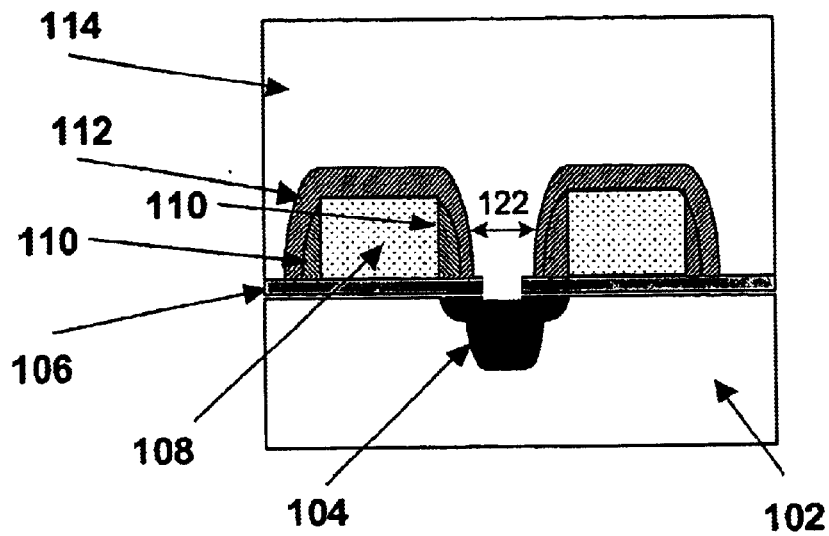
FIG. 1A is a diagrammatic side view of a partially fabricated self-aligned contact prior to a self-aligned contact etch process.
Figure 1B:
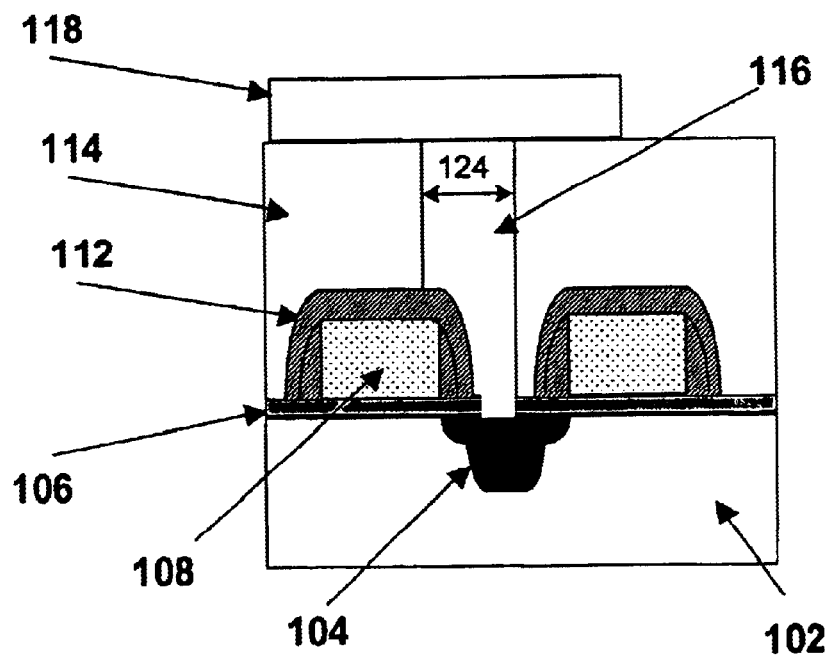
FIG. 1B illustrates a diagrammatic side view of the self-aligned contact after the self-aligned contact etch process completes without etching through the thin insulating layer.
Figure 1C:
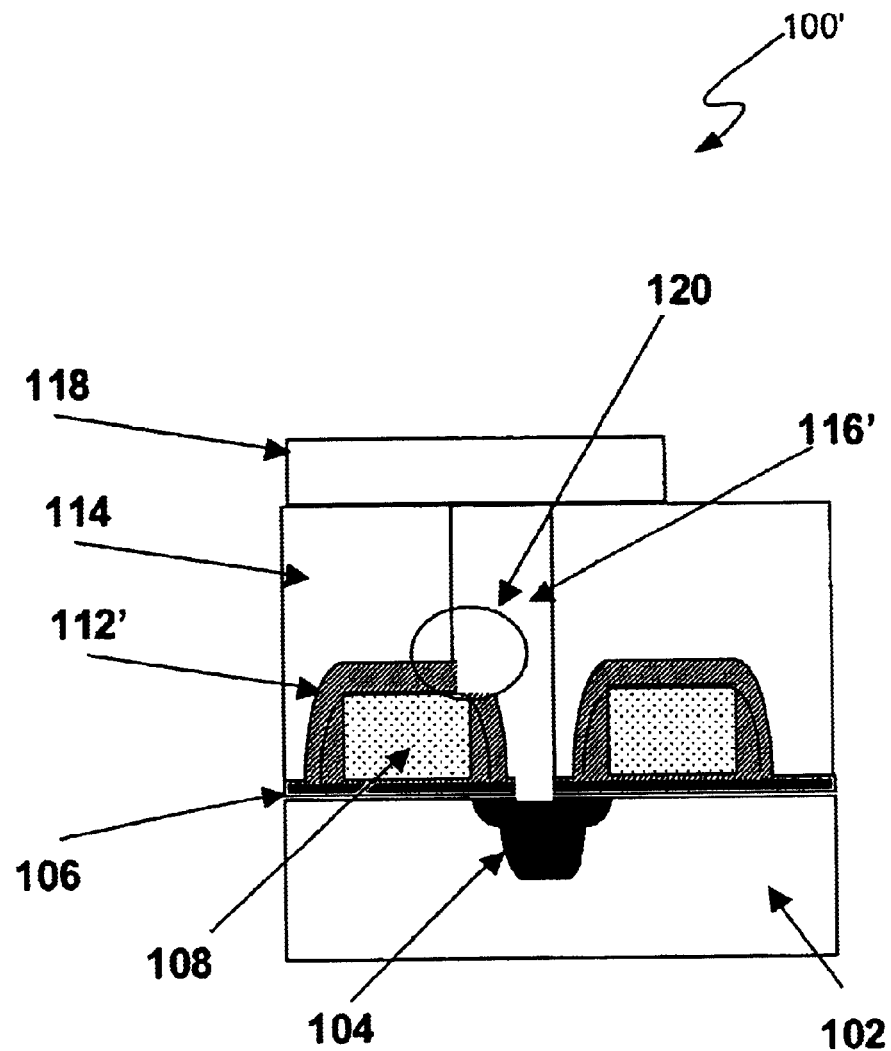
FIG. 1C is a diagrammatic side view of a self-aligned contact with a barrier layer that has been breached by the self-aligned contact etch process.

During this inspection, each self-aligned contact includes an unfilled via formed within a dielectric or insulating layer 350 and positioned over a contact portion 352 (e.g., a source or drain of a DRAM cell transistor) as shown in FIG. 3B. That is, the via has not yet been filled with a conductive plug (as shown in FIG. 1A). Accordingly, the electron beam is scanned over each unfilled vias. After or during the electron beam scan, each via will have a specific potential that may be indicated as a particular brightness level within an image generated from charged particles, such as secondary or backscattered electrons, emitted from the self-aligned contacts. These electrons are generated in response to the scanning electron beam.

Figure 4A:
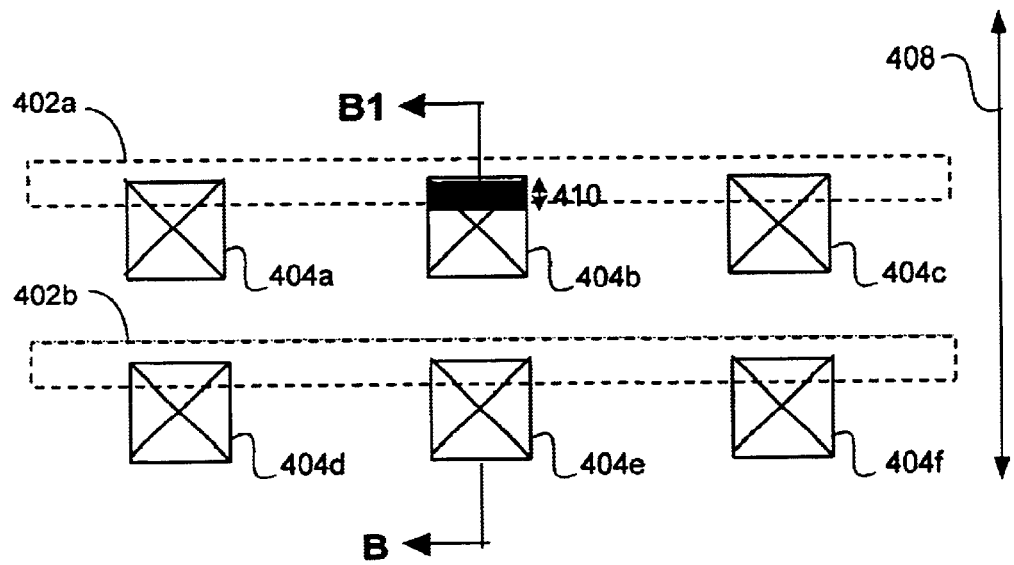
FIG. 4A is a top view of a scan of a plurality of self-aligned contacts having a defect in accordance with one embodiment of the present invention.
Figure 4B:
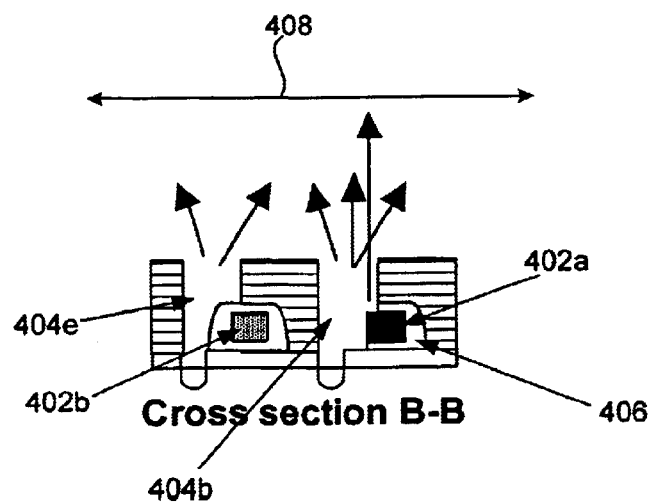
FIG. 4B is a cross sectional view of the scan of the self-aligned contacts FIG. 4A.

When there is no defect present within the scanned self-aligned contacts, they tend to have about the same potential level. In other words, the electrons will tend to be absorbed or emitted in a similar manner when there is no defect present within the self-aligned contacts. When there is not a significant difference in potential or brightness level among the scanned vias, it is determined that the self-aligned contacts do not contain defects. However, a defective self-aligned contact will have different potential than the non-defective contacts. FIGS. 4A and 4B illustrate a scan of a plurality of self-aligned contacts having a defect in accordance with one embodiment of the present invention. FIG. 4A is a top view, and FIG. 4B is a cross section B—B of FIG. 4A. The electron beam scans relative to the self-aligned contacts in direction 408 or orthogonal to it.

When there is a defect present in one of the self-aligned contacts, the potential and brightness level of the defective contact significantly differs from the other non-defective self-aligned contacts. For example, an image of contact 404b has a dark portion 410 (e.g., from exposed gate 402a) that indicates a defect, while the contact 404e does not contain a dark portion. In one embodiment, when a minority of the self-aligned contact have a brightness that is 5 to 100% different than the majority of self-aligned contacts, it is determined that the minority self-aligned contacts have defects.

As shown in FIG. 4B, self-aligned contact 404b is in the form of an unfilled via that is proximate to an exposed gate 402a of a transistor. For example, the thin insulating barrier layer that typically surrounds the gate has been inadvertently etched away during formation of the self-aligned contact via 404b. When the via and exposed gate 402a are bombarded by electrons within the beam, the gate charges differently than the vias which do not have an exposed gate. Of course, the via may contain any type of exposed conductive line surrounded by any type of insulating layer, instead of an exposed gate and barrier layer of a transistor, and such exposed conductive line will tend to charge differently than other vias without exposed conductive lines.

In one embodiment, the exposed gate 402a repels or emits more or less electrons than other self-aligned contacts with unexposed gates. In the DRAM example, the gates are typically formed from a conductive material that acts as a source of secondary electrons and appears bright (depending on the SEM configuration) of the via 404b. In contrast, the unexposed gate 402b does not serve as an electron source since it is not exposed to the beam. Additionally, the other via components are formed from an insulating material (e.g., the insulating barrier layer and the dielectric layer) that is at a floating potential. These types of structures tend to charge up and not result in as many secondary electrons as the defective via. For example, the defective exposed gate 402a will appear bright, and the unexposed gates (e.g., 404e) will appear dark. For illustrative purposes, the defects are shown and described as having a dark appearance, although they tend to have a brighter appearance than the nondefective vias or contacts.

A voltage contrast inspection allows one to determine the location of each defect. For example, the inspection tool tracks each self-aligned contact's position as the electron beam is scanned over the self-aligned contacts. When a defect is found, the coordinates of the electron beam or sample stage correspond to a location on the scanned sample. Thus, the location of the defect may be easily determined by the electron beam system and/or the wafer stage location. Knowing the locations of each defect facilitates further analysis of the root cause of the failure (e.g., process to tool integration). Such analysis will likely result in an accelerated yield ramp.

Accordingly, defect detection may be performed immediately following the self-aligned contact etch process prior to filling the self-aligned contact vias with a conductive via and adding a second layer of conductive lines of the plugs. The promptness of the inspection and the ability to detects defects significantly reduces the product at risk time delta. The saving in elapsed time can be in the order of several days and hence reduces the risk of lost products because of yield loss. These savings in time and yield translate into significant cost savings. Additionally, the inspection is done in-line as part of the process flow. That is, the product is not removed from the clean room and can therefore, continue to be processed or reworked (if needed). Additionally, voltage contrast testing is contact-free and therefore does not require extra probe pads to inspect the self-aligned contact structures.

Figure 5A:
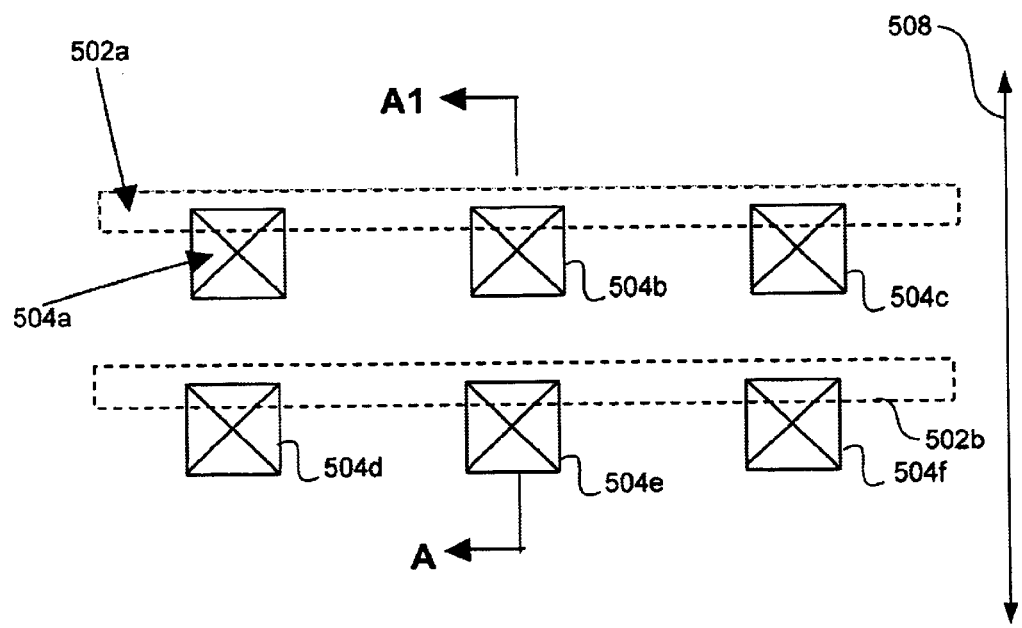
FIGS. 5A and 5B illustrate a top view and cross sectional view, respectively, of a scan of a plurality of self-aligned contacts having no defects after conductive plugs have been inserted in accordance with one embodiment of the present invention.
Figure 5B:
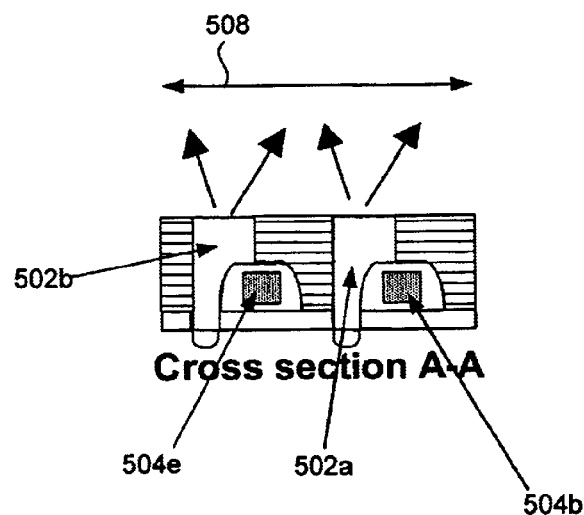

FIGS. 5A and 5B illustrate a top view and side view, respectively, of a scan of a plurality of self-aligned contacts having no defects after conductive plugs 502 have been inserted in accordance with one embodiment of the present invention. FIG. 5B is a cross section B—B of FIG. 5A. The electron beam scans relative to the self-aligned contacts in direction 508 or orthogonal to it. When the non-defective plugs 502 are scanned, they tend to have about the same potential and resulting image brightness levels. When there is not a significant difference in potential among the scanned vias and their associated conductive plugs, it is determined that the self-aligned contacts do not contain defects.

Figure 6A:
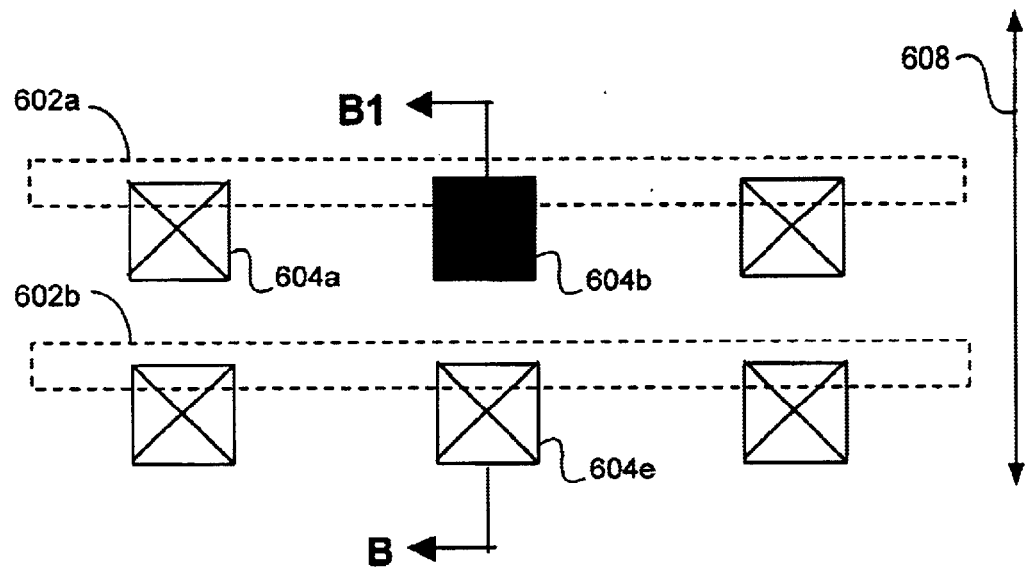
FIGS. 6A and 6B illustrate a top view and cross sectional view, respectively, of a scan of a plurality of self-aligned contacts after conductive plugs have been inserted having a defect in accordance with one embodiment of the present invention.
Figure 6B:
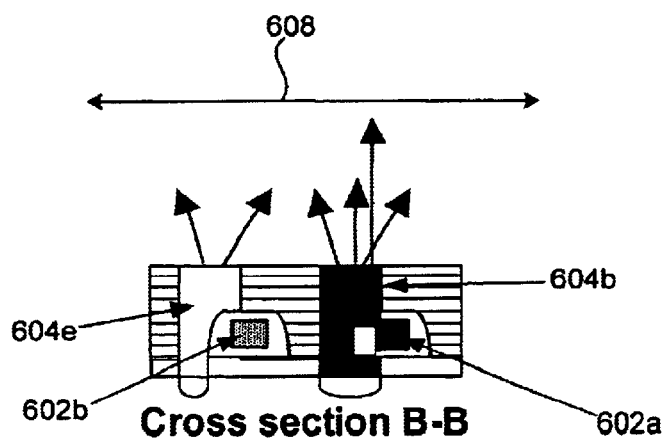

FIGS. 6A and 6B illustrate a top view and cross sectional view, respectively, of a scan of a plurality of self-aligned contacts after conductive plugs 502 have been inserted having a defect in accordance with one embodiment of the present invention. FIG. 6B is a cross section A—A of FIG. 6A. The electron beam scans relative to the self-aligned contacts in direction 608 or orthogonal to it. The self-aligned contacts are scanned with an electron beam in direction 608 or orthogonal to it. As shown, conductive plug of self-aligned contact via 604b has a different potential or brightness level than the other conductive plugs (e.g., 604e) without defects. When a scanned contact via has a significantly different potential or brightness level than a majority of the other scanned vias, it is considered to have a defect. In one embodiment, when a minority of the self-aligned contacts have a brightness that is 5 to 100% different than the majority of self-aligned contacts, it is determined that the minority self-aligned contacts have defects.

As shown in FIG. 6B, the conductive plug 604b has shorted to the gate 602a thereby causing a defect. When an electron beam scans over the defective plug 604b, it produces more or less secondary electrons than the non-defective plugs (e.g., 604a and 604e). Hence, an image of the defective conductive plug has a brighter or darker intensity than the non-defective plugs. The imaged defect area is larger when the vias are filled with conductive material than when they are left unfilled. Thus, defects are more easily recognized after the conductive plugs have been inserted within the vias. However, this process requires more time before defects are detected.

Figure 7A:
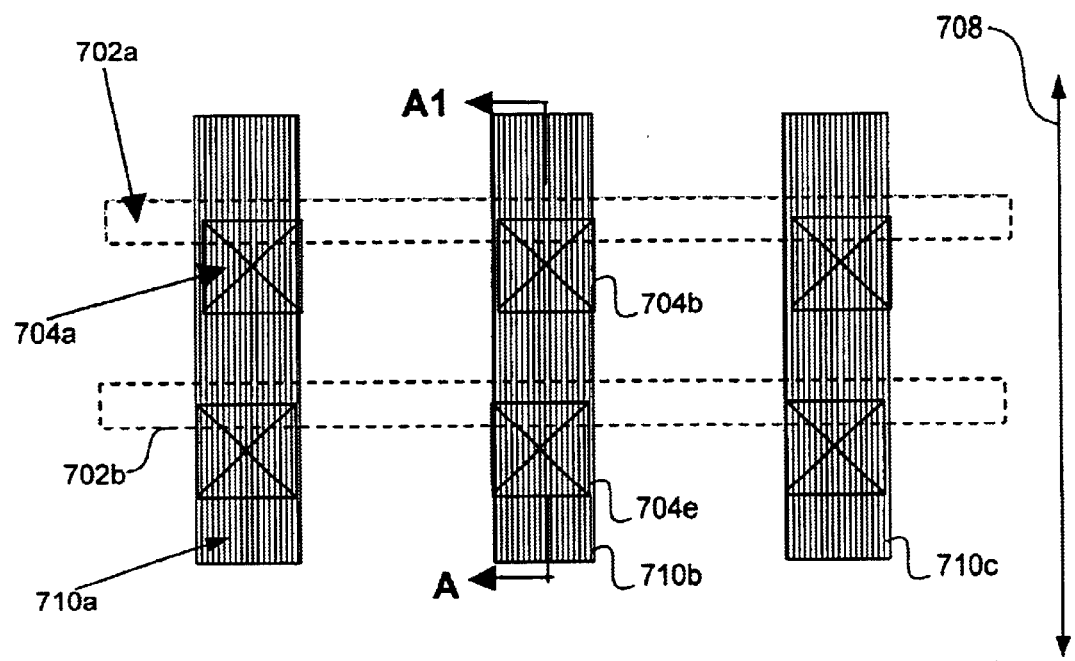
FIGS. 7A and 7B illustrate a top view and cross sectional view, respectively, of a scan of a plurality of self-aligned contacts having no defects after a plurality of conductive lines are patterned over the self-aligned contact vias in accordance with one embodiment of the present invention.
Figure 7B:
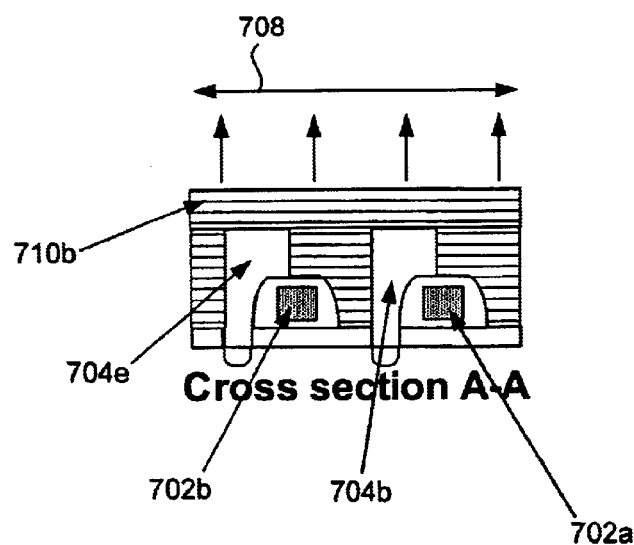

FIGS. 7A and 7B illustrate a top view and cross sectional view, respectively, of a scan of a plurality of self-aligned contacts after a plurality of conductive lines 710 are patterned over the self-aligned contact vias in accordance with one embodiment of the present invention. FIG. 7B is a cross section A—A of FIG. 7A. The electron beam scans relative to the self-aligned contacts in direction 708 or orthogonal to it. However, the beam may be scanned in a direction perpendicular to direction 708 or orthogonal to it across a portion of the conductive lines 710. For example, the ends of the conductive lines may be scanned. In the illustrated embodiment, the self-aligned contacts do not contain defects. When the nondefective conductive lines 701 are scanned with an electron beam, they will all appear to have the same approximate potential or brightness value. When there is not a significant difference in potential or brightness among the scanned conductive lines 710, it is determined that the self-aligned contacts do not contain defects.

Figure 8A:
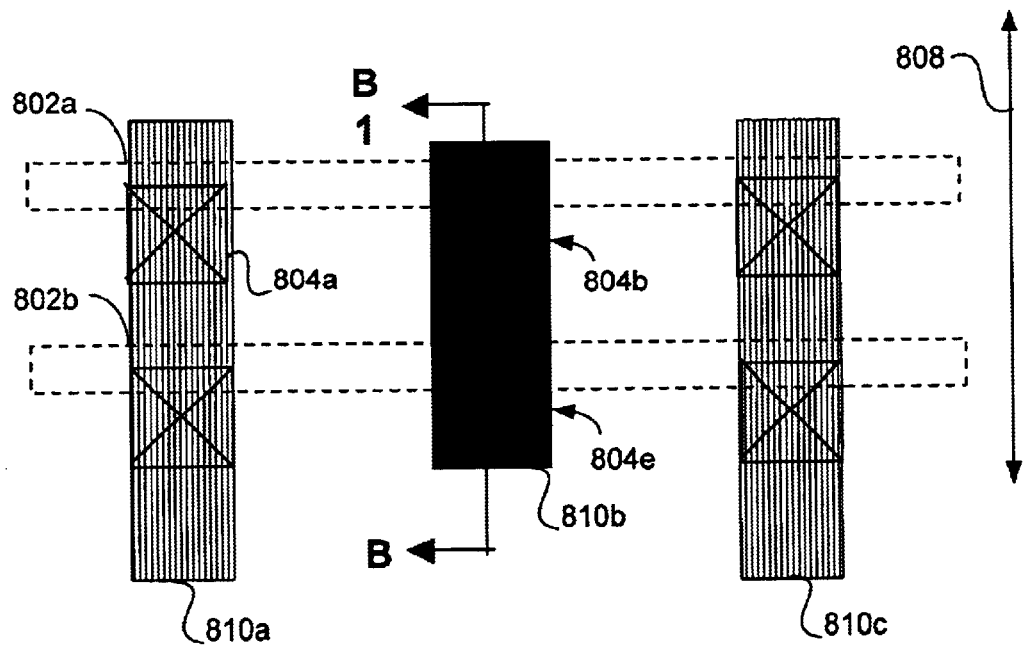
FIGS. 8A and 8B illustrate a top view and cross sectional view, respectively, of a scan of a plurality of self-aligned contacts having a defect after a plurality of conductive lines are patterned over the self-aligned contact vias in accordance with one embodiment of the present invention.
Figure 8B:
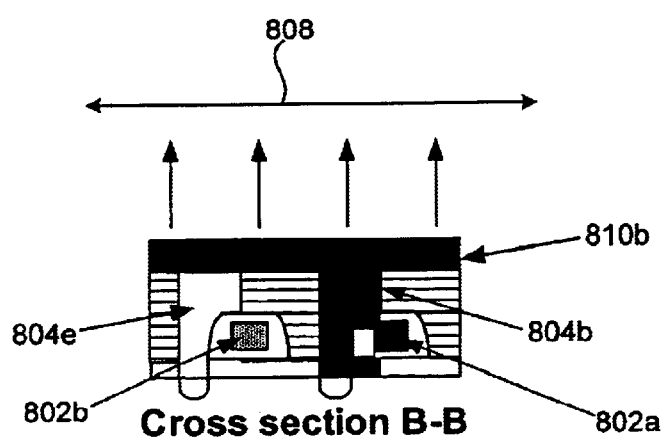

FIGS. 8A and 8B illustrate a scan of a plurality of self-aligned contacts having a defect. FIG. 8B is a cross section B—B of FIG. 8A. The electron beam scans relative to the self-aligned contacts in direction 808 or orthogonal to it. When there is a defect in any of the self-aligned contacts, its associated conductive line 810 will have a significantly different potential or brightness level than the non-defective conductive lines. As shown in the top view of FIG. 8A, conductive line 810b appear dark, while conductive lines 810a and 810c appear bright. Thus, conductive line 810b would be classified as having a defect. As shown in FIG. 8B, the conductive line 810b is coupled to conductive plug 804b, which is shorted to gate 802a. As in the previous embodiments, when a minority of the self-aligned contacts have a brightness that is 5 to 100% different than the majority of self-aligned contacts, it is determined that the minority self-aligned contacts have defects.

As described above, the self-aligned contacts being inspected may form part of a product structure. The self-aligned contacts may form active components in a product structure or form dummy component in a product structure. In one embodiment, dummy self-aligned contacts may be deactivated by applying a high voltage or high energy pulse to the conductive plug after the self-aligned contacts are inspected. The high voltage or energy pulse generally vaporizes the conductive plug. Of course, any mechanisms may be used to blow or deactive the plug and depend on the type of anti-fuse material used. Alternatively, the plugs may be formed from fuse type material. For example, the vias are filled with weak conductive material, such as amorphous silicon or undoped polysilicon. The plugs may be fused by applying a heat pulse or an electron beam to spot anneal the plug. The application of a heat pulse transforms the weak conductive plug into a strong conductive plug.

Figure 9A:
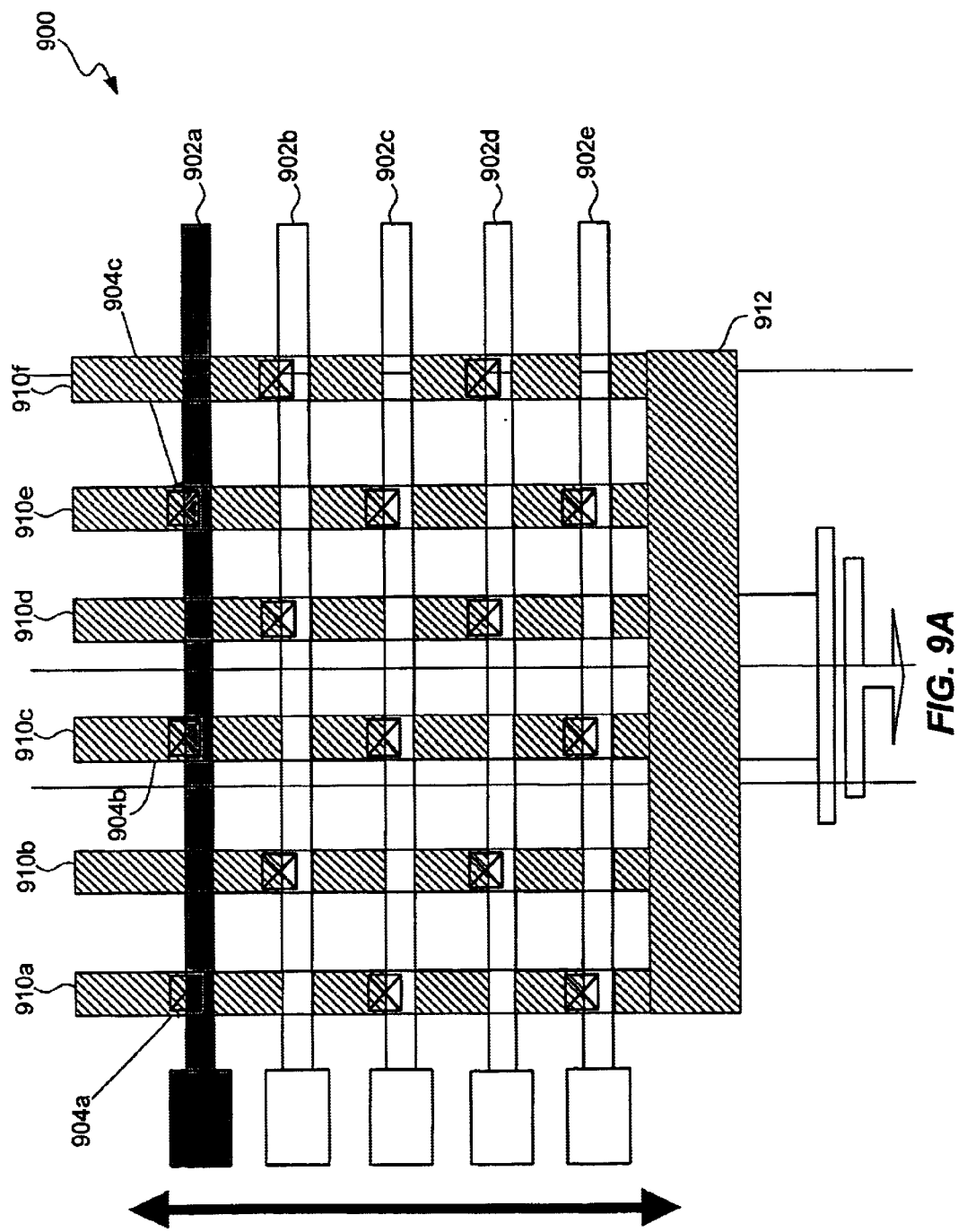
FIG. 9A is a diagrammatic top view representation of a test structure in accordance with one embodiment of the present invention.

The self-aligned contacts may also form a test structure that mimics a product structure. The test structure is formed on a product wafer. FIG. 9A is a diagrammatic top view representation of a test structure 900 in accordance with one embodiment of the present invention. In general terms, the test structure 900 mimics an array of self-aligned contacts. However, the test structure may mimic any product structure having a plurality of self-aligned contacts. As shown, the test structure 900 includes a plurality of self-aligned contacts 904 associated with word lines 902 and bit lines 910. Of course, the word lines and bits lines may represent any form of conductive lines when mimicking a different type of product structure.

In the illustrated embodiment, the word lines 902 and bit lines 910 are arranged orthogonal to each other. Similar to a product self-aligned contact array, the word lines 902 are designed to be floating, while the bit lines 910 are designed to be at a predetermined voltage, such as ground 912. In this embodiment, the bit lines 910 are tied together. However, other test structure embodiments may include bits lines that are individually tied to ground or another potential.

If the test structure is properly formed, the bit lines will appear to have a particular intensity, while the word lines will charge differently than the bits lines when scanned with an electron beam. In a generated image, the word lines will appear to have a different brightness than the word lines. Said in another way, the bit lines will have a same first intensity that differs from a second intensity of the word lines. In one embodiment, an electron beam scans in direction 908 (or orthogonal to it) over the end portions 920 of word lines 902. If a self-aligned contact within a particular word line 902 contains a defect, its end portion 902 will have a significantly different potential and brightness value (e.g., greater than 5 to 100%) than the non-defective end portions. As shown, word line 902a appears darker than the other word lines 902b through 902e. A defect may occur when a word line is shorted to a bit line. As shown, bit line 910a is shorted to word line 902a. Hence, self-aligned contact 904a is determined to be defective. Since this test structure is formed in a similar manner as the above describe product structures, defects may be found prior to filling the self-aligning contacts with a conductive plug or prior to placement of the conductive line (e.g., 902) using the same above described techniques as used for the product structures.

Figure 9B:
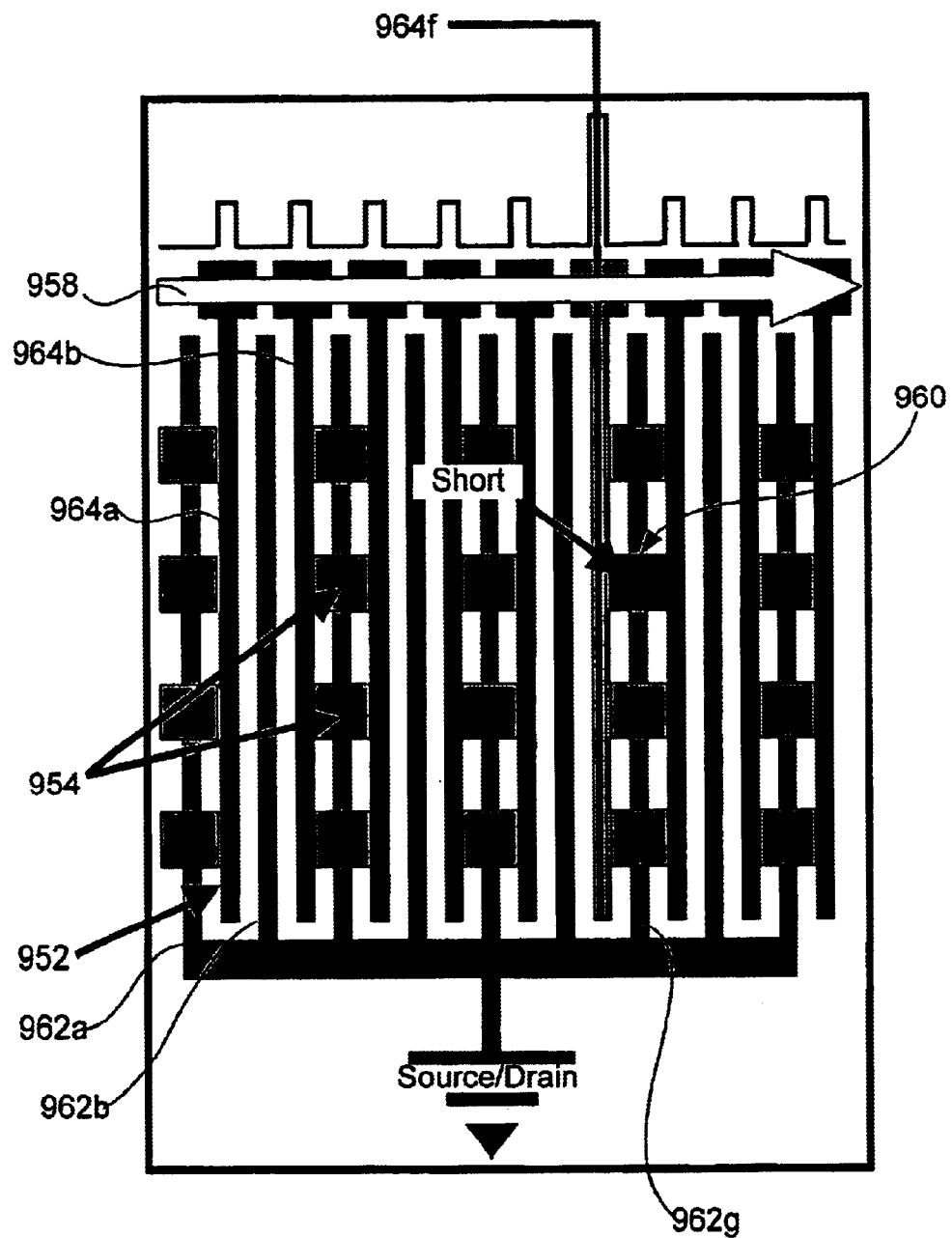
FIG. 9B is a diagrammatic top view representation of a test structure in accordance with an alternative embodiment of the present invention.

Any other suitable type of test structure may be configured to mimic self-aligning contacts. Several inventive test structures designed by the present assignee are disclosed in co-pending U.S. patent application Ser. No. 09/648,093 by Satya et al., filed 25 Aug. 2000, which application is incorporated herein in its entirety. An alternative to the test structure of FIG. 9A is shown in FIG. 9B. As shown, the test structure is a comb type test structure having a first plurality of conductive lines 962 shaped into a comb and a second plurality of conductive lines 964. The first set of lines 962 are interleaved with the second set of lines 964. Additionally, the first set of lines 962 are designed to be coupled to ground, while the second set of lines 964 are designed to be floating. The first set of lines mimic bit lines 962, while the second set 964 mimic word lines (or gates). There is a dielectric or insulating material between the bit lines 962 and word lines 964. A plurality of self-aligning contacts 954 are associated with the first set of lines 962 in an array pattern to mimic, for example, a memory structure.

In one embodiment, the top portion 958 of the lines 964 may be scanned by an electron beam in direction 958. When the electron beam moves across these lines 964, the lines 964 are expected to have the same intensity value when there is no defect present. However, if two adjacent lines 964 and 962 are shorted together, the shorted line 964 will have a different intensity than the other nondefective lines 964. As shown, a short 960 is present between lines 964f and 962g. Thus, line 964f has a different intensity value than other nondefective lines 964 (e.g., 964a and b), and line 964f is classified as defective. Since this test structure is formed in a similar manner as the above describe product structures, defects may be found prior to filling the self-aligning contacts with a conductive plug or prior to placement of the conductive line (e.g., 962) using the same above described techniques as used for the product structures.

Figure 10:
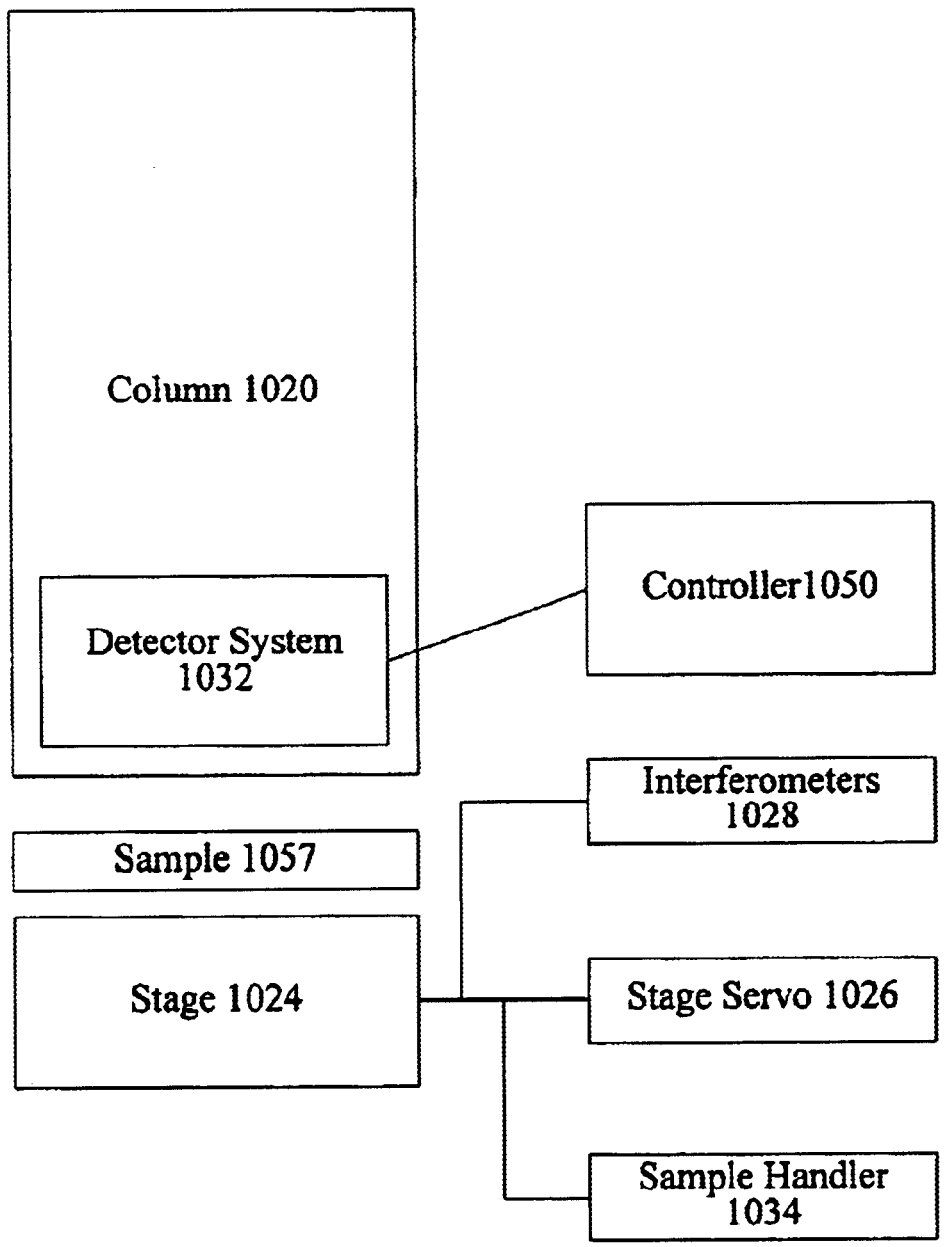
FIG. 10 is a diagrammatic representation of a system in which the techniques of the present invention may be implemented.

FIG. 10 is a diagrammatic representation of a scanning electron microscope (SEM) or an e-beam review or inspection system system in which the techniques of the present invention may be implemented. The detail in FIG. 10 is provided for illustrative purposes. One skilled in the art would understand that variations to the system shown in FIG. 10 fall within the scope of the present invention. For example, FIG. 10 shows the operation of a particle beam with a continuously moving stage. However, the test structures and product structures and many of the inspection techniques described herein are also useful in the context of other testing devices, including particle beams operated in step and repeat mode. As an alternative to moving the stage with respect to the beam, the beam may be moved by deflecting the field of view with an electromagnetic lens. Alternatively, the beam column to be moved with respect to the stage.

Sample 1057 can be secured automatically beneath a particle beam 1020. The particle beam 1020 can be a particle beam such as an electron beam. The sample handler 1034 can be configured to automatically orient the sample on stage 1024. The stage 1024 can be configured to have six degrees of freedom including movement and rotation along the x-axis, y-axis, and z-axis. In a preferred embodiment, the stage 1024 is aligned relative to be particle beam 1020 so that the x-directional motion of the stage is corresponds to the axis determined by the length of a via. For example, the sample 1057 can be aligned so that the x-directional movement of the stage corresponds to the length of a via as viewed from the top of the sample. Similarly, the sample 1057 can be aligned so that the x-directional movement of stage corresponds to the width of a via. Fine alignment of the sample can be achieved automatically or with the assistance of a system operator. The position and movement of stage 1024 during the analysis of sample 1057 can be controlled by stage servo 1026 and interferometers 1028.

While the stage 1024 is moving in the x-direction, the inducer 1020 can be repeatedly deflected back and forth in the y direction. According to various embodiments, the inducer 1020 is moving back and forth at approximately 100 kHz. According to a preferred embodiment, the stage 1024 is grounded to thereby ground the substrate and any structure tied to the substrate (e.g., source and drains) to allow voltage contrast between the floating and grounded structures as the result of the scan of the scan target.

A detector 1032 can also be aligned alongside the particle beam 1020 to allow further defect detection capabilities. The detector 1032 as well as other elements can be controlled using a controller 1050. Controller 1050 may include a variety of processors, storage elements, and input and output devices. The controller may be configured to implement the techniques of the present invention. In one embodiment, the controller is a computer system having a processor and one or more memory devices.

Regardless of the controller's configuration, it may employ one or more memories or memory modules configured to store data, program instructions for the general-purpose inspection operations and/or the inventive techniques described herein. The program instructions may control the operation of an operating system and/or one or more applications, for example. The memory or memories may also be configured to store images of scanned samples and defect classification and position data.

Because such information and program instructions may be employed to implement the systems/methods described herein, the present invention relates to machine readable media that include program instructions, state information, etc. for performing various operations described herein. Examples of machine-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). The invention may also be embodied in a carrier wave travelling over an appropriate medium such as airwaves, optical lines, electric lines, etc. Examples of program instructions include both machine code, such as produced by a compiler, and files containing higher level code that may be executed by the computer using an interpreter.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

What is claimed is:

1. A method of detecting defects in a plurality of self-aligned contacts, wherein that each contact has a via, the method comprising:

scanning a charged particle beam over a first via adjacent to an insulating layer of the self-aligned contacts on the partially fabricated semiconductor device to obtain a first intensity value of the first via based on charged particles emitted from the first via in response to the charged particle beam, wherein the first via is scanned prior to inserting a plug into the first via; and when the first intensity value is significantly different than an expected intensity value, determining that the first via has an associated defect of a breach in the insulating layer, wherein the first intensity value is significantly different than the expected intensity value when it has a bright appearance and the expected intensity value has a dark appearance or visa versa.

2. A method as recited in claim 1, each self-aligned contact comprising:

a first layer with a plurality of contact portions;

a second layer with a plurality of conductive lines that are each aligned proximate to an associated underlying contact portion; and a third insulating layer formed over the conductive lines and their proximate underlying contact portions, wherein the vias are formed within the third insulating layer, alongside a one of the conductive lines, and over its proximate underlying contact portion, wherein a defect of the first via is in the form of a breach in the insulating layer over the conductive lines so that the conductive line is exposed to the particle beam as it scans over the first via, as compared with another of the conductive lines that is not defective and has the insulating layer disposed between itself and the associated via so as to form a barrier against the particle beam.

3. A method as recited in claim 1, further comprising determining a location of the defect from a position of the charged particle beam or a position of a stage that holds the semiconductor device when the first via is imaged and found to have a defect, which position is correlated to a position on the semiconductor device.

4. A method as recited in claim 1, wherein the scanning is performed in-line with fabrication of the semiconductor device.

5. A method as recited in claim 1, wherein the self-aligned contacts form part of product structure on a product wafer.

6. A method as recited in claim 5, wherein the self-aligned contacts are arranged in an array structure.

7. A method as recited in claim 2, wherein each contact portion forms a source or drain of a transistor and each proximate conductive line forms a gate of the transistor separated from the proximate contact source/drain by an oxide layer and the third insulating layer.

8. A method as recited in claim 7, wherein the third insulating layer comprises:

a plurality of dielectric spacer with a pair of spacers being on each side of each gate, a barrier layer over each pair of spacers, and a interlayer dielectric layer fanned over the barrier layer and contact portions, wherein the vias are formed by an etch process that is selected to etch through the interlayer dielectric layer and not the barrier layer.

9. A method as recited in claim 8, wherein the defect of the first via is in the form of a breach in the barrier layer over a one of the conductive lines so that the conductive line is exposed to the particle beam as it scans over the first via, as compared with another of the conductive lines that is not defective and has the barrier layer disposed between itself and the associated via so as to form a barrier against the particle beam.

10. A method as recited in claim 2, further comprising:

providing a conductive plug within the first via prior to a second scanning of the first via;

scanning a charged particle beam over the conductive plug of the first via of the self-aligned contacts on the partially fabricated semiconductor device to obtain a second intensity value of the conductive plug of the first via based on charged particles emitted from the conductive plug of the first via in response to the charged particle beam; and when the second intensity value is significantly different than the expected intensity value, determining that the conductive of the first via has an associated defect, wherein the second intensity value is significantly different than the expected intensity value when it has a bright appearance and the expected intensity value has a dark appearance or visa versa.

11. A method as recited in claim 10, wherein the defect associated with the conductive plug of the first via is in the form of a breach in the insulating layer over a one of the conductive lines so that the conductive line is shorted to the conductive plug.

12. A method as recited in claim 10, wherein the defect associated with the conductive plug of is in the form of an open defect within the conductive plug where a top surface of the conductive plug is not electrically coupled with its associated underlying contact portion.

13. A method as recited in claim 10, wherein the conductive plug of the first via is formed from a fuse material, the method further comprising fusing the conductive plug prior to scanning the first via.

14. A method as recited in claim 10, wherein the conductive plug of the first via is formed from a anti-fuse material the method further comprising deactivating the anti-fuse plug after it is scanned.

15. A method as recited in claim 14, wherein the self-aligned contacts form dummy structures that are coupled with a product array of self-aligned contacts.

16. A method as recited in claim 2, the method further comprising:

providing conductive plugs within each via and a fourth layer having a plurality of conductive lines each coupled to a one of the conductive plugs;

scanning a charged particle beam over a first line of the fourth layer of conductive lines to obtain a second intensity value of the first line; and when the second intensity value is significantly different than the expected intensity value, determining that a via associated with the first line has a defect, wherein the second intensity value is significantly different than the expected intensity value when it has a bright appearance and the expected intensity value has a dark appearance or visa versa.

17. A method as recited in claim 16, wherein the second layer of conductive lines forms a plurality of word lines within a memory array and the fourth layer of conductive lines form a plurality of word lines within the memory array.

18. A method as recited in claim 17, wherein the memory array is selected from a group consisting of a DRAM, SRAM, ROM, EPROM, EEPROM, and flash memory.

19. A method as recited in claim 1, wherein the self-aligned contacts form part of a product device selected from a group consisting of a group consisting of a memory, gate array, sea-of-gates, microprocessor, microcontroller, and micromechanical device.

20. A method as recited in claim 1, further comprising obtaining the expected intensity value from a majority of the other vias by scanning the charged particle beam over each of the majority of vias of the self-aligned contacts.

21. A method as recited in claim 1, wherein the first intensity value is significantly different than the expected intensity value when the difference has a range between about 5 and 100 percent.

* * * * *

UNITED STATES PATENT AND TRADEMARK OFFICE
CERTIFICATE OF CORRECTION

PATENT NO. : 6,855,568 B2 Page 1 of 1
DATED : February 15, 2005
INVENTOR(S) : Weiner et al.

It is certified that error appears in the above-identified patent and that said Letters Patent is hereby corrected as shown below:

Column 13,
Line 42, change "layer fanned" to -- layer formed --.

Signed and Sealed this

Sixteenth Day of August, 2005

JON W. DUDAS
*Director of the United States Patent and Trademark Office*